(12) United States Patent
Morale et al.

(10) Patent No.: US 9,324,803 B2
(45) Date of Patent: Apr. 26, 2016

(54) SUPERJUNCTION POWER DEVICE AND MANUFACTURING METHOD

(71) Applicant: STMICROELECTRONICS S.r.l., Agrate Brianza (IT)

(72) Inventors: Giuseppe Morale, Catania (IT); Carlo Magro, San Giovanni La Punta (IT); Domenico Murabito, Catania (IT); Tiziana Cuscani, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 183 days.

(21) Appl. No.: 14/283,045

(22) Filed: May 20, 2014

(65) Prior Publication Data
US 2014/0346588 A1 Nov. 27, 2014

(30) Foreign Application Priority Data
May 22, 2013 (IT) .............................. TO2013A0410

(51) Int. Cl.
*H01L 29/772* (2006.01)
*H01L 29/10* (2006.01)
*H01L 29/66* (2006.01)
*H01L 29/78* (2006.01)
*H01L 21/324* (2006.01)
*H01L 29/739* (2006.01)
*H01L 29/06* (2006.01)
*H01L 21/02* (2006.01)

(52) U.S. Cl.
CPC ........ *H01L 29/1095* (2013.01); *H01L 21/0243* (2013.01); *H01L 21/0262* (2013.01); *H01L 21/02532* (2013.01); *H01L 21/02639* (2013.01); *H01L 21/3247* (2013.01); *H01L 29/0634* (2013.01); *H01L 29/66348* (2013.01); *H01L 29/66712* (2013.01); *H01L 29/7397* (2013.01); *H01L 29/7802* (2013.01); *H01L 29/7811* (2013.01); *H01L 29/7813* (2013.01); *H01L 21/02634* (2013.01)

(58) Field of Classification Search
CPC ..................... H01L 29/66712; H01L 29/7802; H01L 29/7813; H01L 29/7827
See application file for complete search history.

(56) References Cited

U.S. PATENT DOCUMENTS

| | | | |
|---|---|---|---|
| 6,228,719 B1 | 5/2001 | Frisina et al. | |
| 6,300,171 B1 | 10/2001 | Frisina | |
| 6,404,010 B2 | 6/2002 | Saggio et al. | |
| 6,586,798 B1 | 7/2003 | Frisina | |
| 7,944,018 B2 | 5/2011 | Anderson et al. | |

(Continued)

FOREIGN PATENT DOCUMENTS

| | | |
|---|---|---|
| WO | 2007/116420 A1 | 10/2007 |
| WO | 2012/020290 A2 | 2/2012 |

*Primary Examiner* — Matthew W Such
*Assistant Examiner* — Scott Stowe
(74) *Attorney, Agent, or Firm* — Seed Intellectual Property Law Group, PLLC

(57) ABSTRACT

A method for manufacturing a semiconductor power device, comprising the steps of: forming a trench in a semiconductor body having a first type of conductivity; partially filling the trench with semiconductor material via epitaxial growth so as to obtain a first column having a second type of conductivity and having an internal cavity. The epitaxial growth includes simultaneously supplying a gas containing dopant ions of the second type of conductivity, hydrochloric acid HCl in gaseous form and dichlorosilane DCS in gaseous form, so that the ratio between the amount of HCl and the amount of DCS has a value of from 3.5 to 5.5.

21 Claims, 8 Drawing Sheets

(56) References Cited

U.S. PATENT DOCUMENTS

| | | |
|---|---|---|
| 8,304,311 B2 | 11/2012 | Lorenti et al. |
| 2007/0072398 A1 | 3/2007 | Shibata et al. |
| 2007/0148931 A1 * | 6/2007 | Tokano .............. H01L 29/0634 438/561 |
| 2011/0169081 A1 * | 7/2011 | Ishikawa ........... H01L 21/02381 257/341 |
| 2011/0244664 A1 | 10/2011 | Liu et al. |

* cited by examiner

SUPERJUNCTION POWER DEVICE AND MANUFACTURING METHOD

BACKGROUND

1. Technical Field

The present disclosure relates to a semiconductor power device and to a corresponding manufacturing method. In particular, the disclosure relates to a method of manufacturing a power device comprising column structures for charge balancing, and to the corresponding device.

2. Description of the Related Art

As is known, in the last few years an attempt has been made to increase the efficiency of the aforesaid devices in terms of increase of the breakdown voltage and decrease of the output resistance of the devices themselves.

The U.S. Pat. Nos. 6,586,798, 6,228,719, 6,300,171, and 6,404,010, all filed in the name of the present applicant, describe methods for solving the problems set forth above. In these patents MOS power devices are described, comprising column structures having a first type of conductivity (for example, P), spaced apart by areas of epitaxial layer having a second type of conductivity (here N). Basically, in order to provide the column structures, a sequence of steps of growth of epitaxial layers of an N type is carried out, each step being followed by a step of implantation of dopant of a P type. Stacking of the implanted regions thus forms column structures that represent an extension of the body regions of the device within the epitaxial layer that constitutes the drain region of the device. The concentration of charge of the dopant introduced via the implants, i.e., the concentration of the column structures of a P type thus formed, is equal, but of opposite sign, to the concentration of charge introduced epitaxially. Consequently, thanks to the charge balance thus obtained, it is possible to provide vertical-conduction power devices with high breakdown voltage and low output resistance, due to the high concentration of the epitaxial layer (Multi-drain approach). Moreover, it is also known that by increasing the density of the elementary strips that form the device, i.e., increasingly packing the device itself, it is possible to increase further the concentration of charge of the epitaxial layer, obtaining devices that, given the same breakdown voltage (linked to the height of the columns), have a progressively lower output resistance.

On the other hand, however, in order to increase the density of the elementary strips of the device, it is necessary to reduce the thermal budget of the device and consequently increase the number of the steps of epitaxial growth.

This determines an increase in the cost of the device, in the cycle time, and in the defectiveness created by the various steps of epitaxial growth. In particular, with reference to the latter problem, each defect left at the interface between one epitaxial layer and the next renders the device less efficient.

Moreover, there exist solutions that seek to reach charge balance via formation of trenches and filling of said trenches with successive layers of polysilicon, thermal oxide, deposited oxide. However, also these solutions do not solve the problem of defectiveness.

The approaches that envisage total or partial filling by means of dielectrics incur principally in two problems: defectiveness induced by stresses due to the fact that the dielectric has a coefficient of thermal expansion different from that of the silicon in which it is embedded, and difficulty in obtaining a process of filling that is simple and repeatable in the case where the "aspect ratio" of the trenches (i.e., the ratio between the depth and the width of the trenches) is high. In order to overcome these difficulties, it has been proposed, according to the U.S. Pat. No. 7,944,018, to leave the trenches empty and seal them only at their surface opening so as not to render them accessible from outside the device. This method presents the disadvantage of being difficult to implement in so far as it involves steps of ion implantation within the trenches using a plurality of angles of implantation so as to reach in a uniform way the internal wall of the trenches, and the presence of intermediate steps of filling, albeit temporary, of the trenches. This is due to the fact that the nature of the materials available for surface closing of the trenches is such that, in order to preserve them during all the steps of formation of the device, they can be deposited only during the terminal manufacturing steps.

Other approaches envisage filling of the trenches with epitaxial silicon (U.S. Pat. No. 8,304,311), but present, however, other drawbacks basically due to the relatively long duration of the filling process and/or to the difficulty of repeatability. In fact, in order to prevent closing of the access to the trench before filling thereof has been completed, it is expedient to slow down the process of growth of the epitaxial silicon within the trench. In this way, the duration of the process of filling of the trench increases considerably.

Instead, if the step of filling of the trench is speeded up, micro-voids may form inside the trenches themselves, randomly distributed, thus causing the process to have a low repeatability in terms of control of the charge introduced, with consequent impact on the performance of the devices thus manufactured.

BRIEF SUMMARY

The present disclosure is directed to providing a method for manufacturing a semiconductor power device, and a corresponding device thus manufactured, that will be able to solve the problems of the known solutions in a simple way and reduce to a minimum the defectiveness present in the device.

One embodiment of the present disclosure is a method that includes manufacturing a semiconductor power device, the manufacturing including forming a trench in a semiconductor body, the body having a first type of conductivity, and forming a first column having a height by partially filling said trench with a semiconductor material via epitaxial growth, the first column having a second type of conductivity, the forming of the first column including forming an internal cavity extending along the height, the internal cavity having a central portion, a first end, and a second end, the first end being separated from the second end by the central portion, both the first and second end being wider than the central portion.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
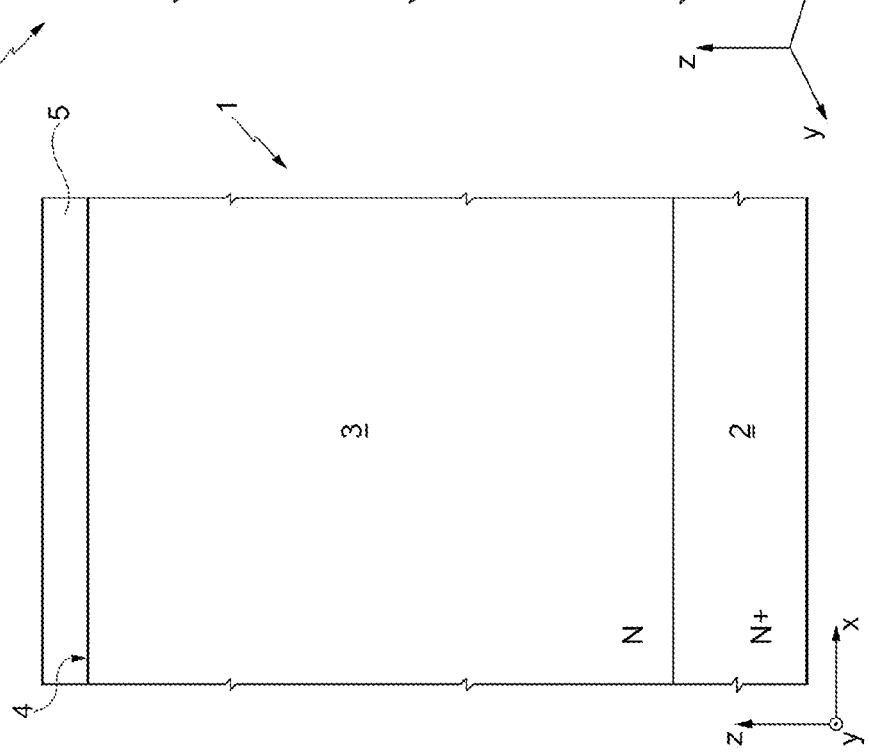

FIG. 1 shows, in lateral cross-sectional view, a portion of a wafer 1 of semiconductor material, typically silicon, comprising a substrate 2 of an N+ or N++ type, preferably with a resistivity lower than 10 mΩ·cm, and an epitaxial layer 3 of an N or N+ type, respectively, with a resistivity preferably comprised between 2 mΩ·cm and 10 mΩ·cm. Moreover formed on the top surface 4 of the epitaxial layer 3 is a mask layer (in what follows, "hard mask") 5 made, for example, of deposited silicon oxide $SiO_2$. It is evident that the hard mask 5 may be made of a material different from silicon oxide, and chosen according to the manufacturing specifications.

Figure 2:
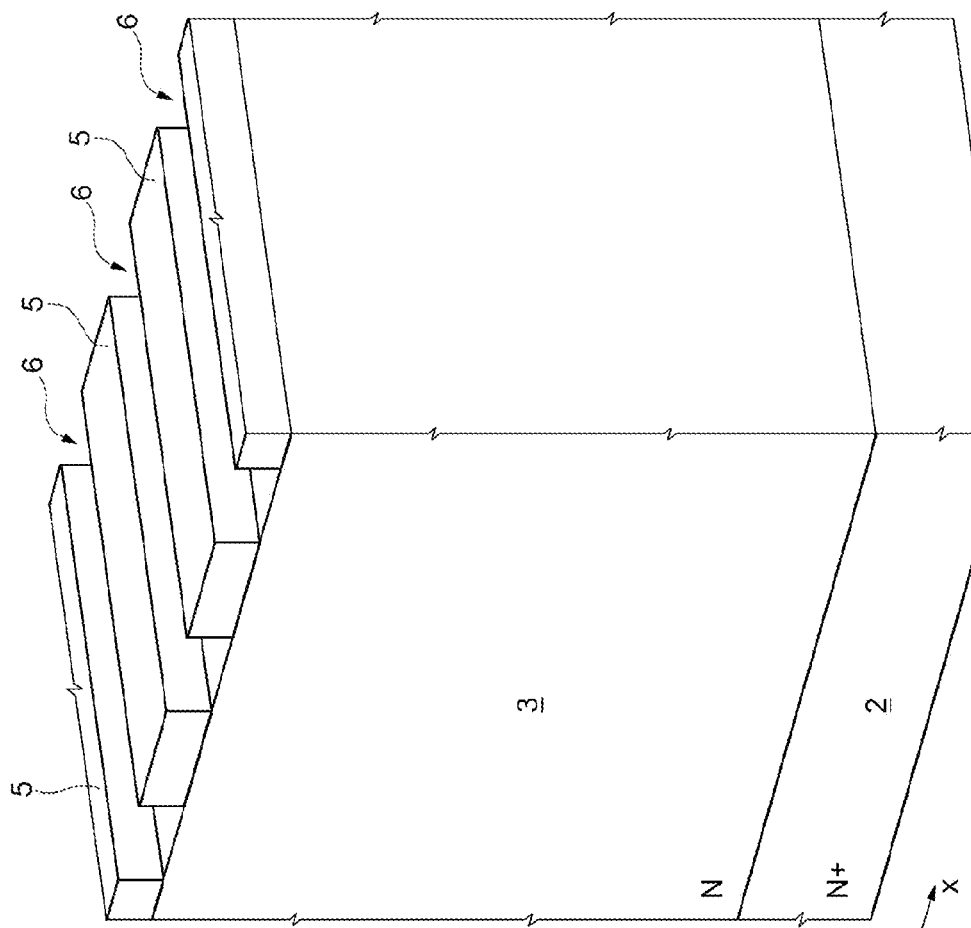
FIGS. 1-4 show a portion of a semiconductor wafer subjected to steps of machining according to the present disclosure.

For a better illustration of the steps of processing of the hard-mask layer 5, FIG. 2 shows the wafer 1 of FIG. 1 in perspective view.

With reference to FIG. 2, the hard-mask layer 5 is defined by depositing a resist layer (not shown), patterning the resist layer using a photolithographic technique, and carrying out a dry etch of the hard-mask layer 5 so as to remove selective portions of the hard mask, designated once again by the reference number 5, in regions of the epitaxial layer 3 in which it is desired to form deep trenches (as illustrated in the following manufacturing steps). In particular, the hard mask 5, processed as described with reference to FIG. 2, includes a plurality of strips separated from one another by windows 6, which are also in the form of strips.

Figure 3:
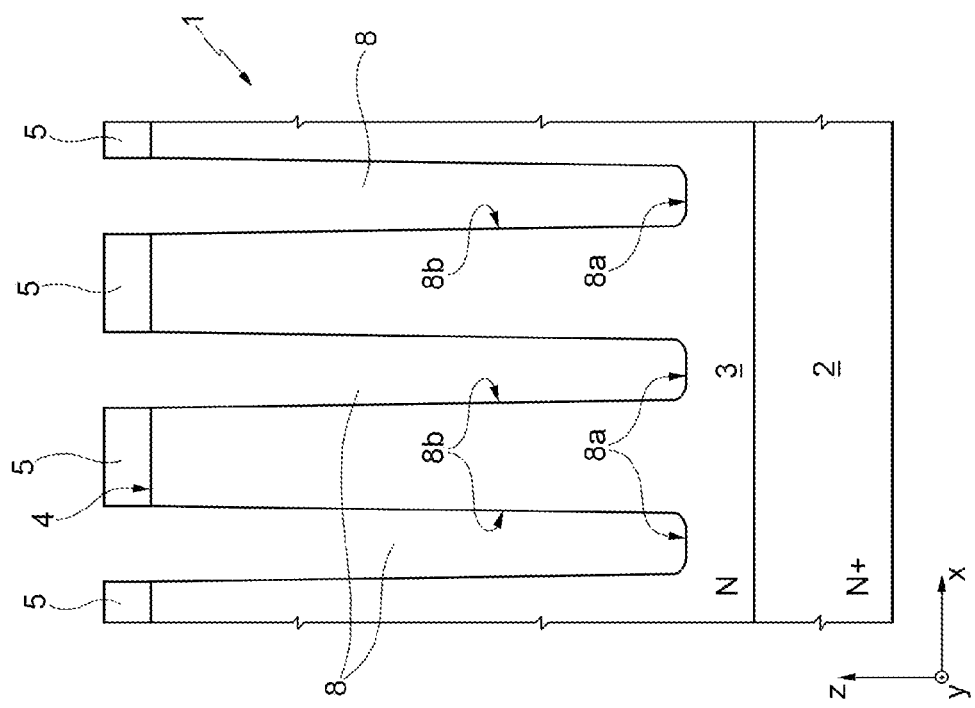

Then (FIG. 3), using the hard mask 5, an anisotropic dry etch of the epitaxial layer 3 is carried out with a mixture, for example, of $SF_6/HBr/O_2$, so as to form deep trenches 8. The trenches 8 are provided in such a way that the respective width, at the level of the surface 4 in the direction X, is comprised between 0.8 and 3.5 µm, preferably 2 µm. The depth of the trenches 8 in the epitaxial layer 3, measured in the direction Z starting from the surface 4, is chosen according to the need, typically from 5 to 130 µm, in particular 30-50 µm.

The distance between two trenches 8 facing one another in the direction X is chosen according to the specifications of the electronic device that it is intended to create, for example comprised between 2 and 10 µm.

Etching of the epitaxial layer 3 is such that the trenches 8 are delimited, at the end of etching, by an internal wall 8b that is substantially vertical along Z. However, in particularly deep trenches 8 (e.g., with a depth of some tens of microns) the angle between the wall 8b of the trenches 8 and the surface 4 of the epitaxial layer 3 may be less than 90°, for example comprised approximately between 85° and 89.5°.

Next, in order to eliminate the products of reaction that adhere within the trenches 8 and remove the hard mask 5, washing is carried out in a number of steps, using the following chemical agents:

first step: $H_2SO_4+H_2O_2$,
second step: HF,
third step: $NH_4OH+H_2O_2$,
fourth step: $HCl+H_2O_2$.

It is evident that, according to the type of etching chemistry used for obtaining the trenches 8, washing may comprise steps and chemical agents different from the ones indicated above, and may be chosen a person skilled in the art.

In the case where it is deemed that the etching chemistry used for providing the trenches 8 does not generate products of reaction that adhere to the inside of the trenches 8, the aforementioned washing may be omitted, and the process carries on only with removal of the hard mask 5, as per the known art.

Then, the wafer 1 is subjected to a high-temperature treatment in a hydrogen environment in order to eliminate the damage introduced by the dry etch and any trace of native oxide. The parameters for this process are, in particular:

pressure: 40-760 Torr,
$H_2$ flow: 30-300 l/m,
temperature of the wafer 1: 1000-1150° C.,
treatment time: 1-30 min.

In this step, annealing at high temperature and in inert environment leads to exposure, on the bottom 8a of the trenches 8, of the crystal planes <100> and <130> and, along the side walls 8b, of the crystal plane <010>, or <110>, according to the crystallographic orientation of the starting wafer.

Figure 4:
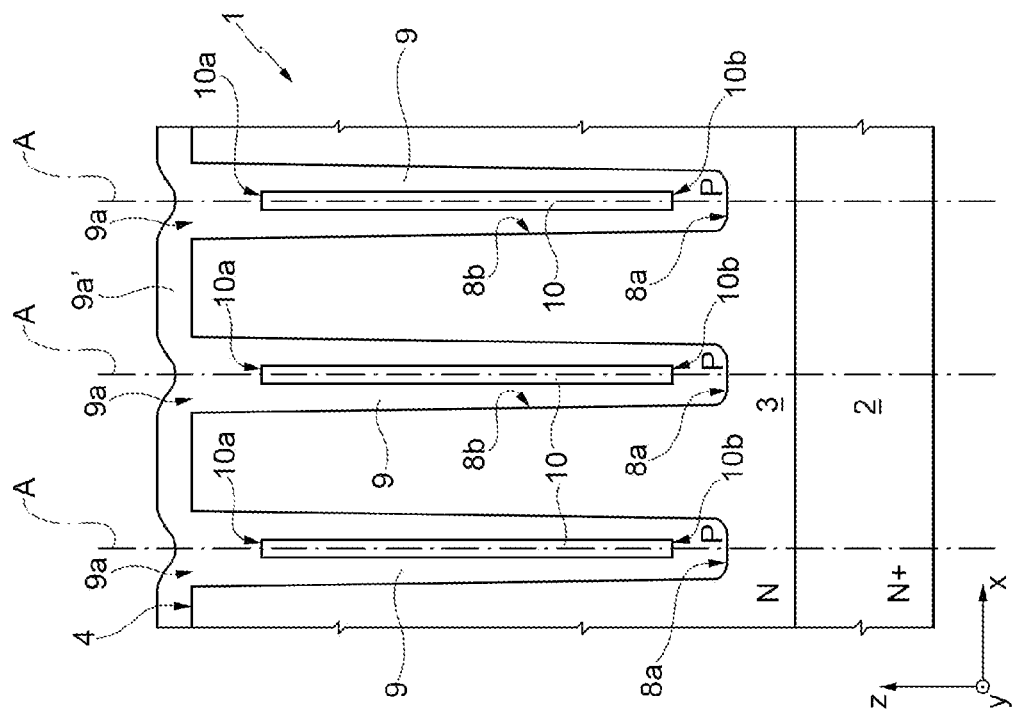

In a subsequent process step, illustrated in FIG. 4, the trenches 8 are partially filled with silicon with a doping of a P type (boron), grown epitaxially.

On account of the absence of the hard mask 5, the epitaxial growth of P-doped silicon in the trenches 8 proceeds both on the bottom 8a of the trenches 8 and on the internal wall 8b of the trenches 8 themselves, and also on the exposed surface 4.

It is known that the rate of epitaxial growth in each trench 8 tends to be greater in regions of the internal wall 8b located in the proximity of the surface 4 as compared to regions of the internal wall 8b located in the proximity of the bottom 8a of the trenches 8. This effect, if not controlled, could produce premature closing of the trenches 8 with consequent formation of a large void within each trench 8a and a non-uniform covering of the internal wall 8b.

For this reason, according to one aspect of the present disclosure, the step of growth is controlled so as to obtain trenches 8 having respective side walls 8b and the bottom 8a uniformly covered by epitaxial silicon. In addition, each trench 8 has a single cavity having controlled and repeatable size and shape. In the embodiment of the present disclosure described hereinafter, the process of epitaxial growth of silicon P in the trenches 8 comprises a single step of epitaxial growth, where the rate of growth along the entire extension of the side walls 8b and of the bottom 8a is modulated by a simultaneous step of etching of the growing epitaxial layer. This effect is obtained, in particular, by exploiting the competitive behavior of hydrochloric acid (HCl) and dichlorosilane (DCS—$SiH_2Cl_2$), where the dichlorosilane feeds, in a way in itself known, growth of epitaxial silicon, and the hydrochloric acid has the function of simultaneous etching of the layer of epitaxial silicon being formed. The choice of an appropriate ratio between the flow of HCl and the flow of DCS ($\Phi_{HCl}/\Phi_{DCS}$) introduced into the reaction chamber enables balancing of the antagonistic behaviors of growth and etching of the epitaxial silicon within the trenches 8.

In particular, in regions of the internal walls 8b of the trenches 8 located in the proximity of the surface 4, as has been said, growth tends to be faster. However, in the same regions, also the action of removal of HCl tends to be more effective. Instead, in regions of the internal walls 8b of the trenches 8 located in the proximity of the bottom of the trenches 8, the etching action of HCl is less effective. It follows that an optimal dosage of DCS and HCl enables as a result a uniform growth of epitaxial silicon to be obtained in any region of the side walls 8b and of the bottom 8a of the trenches 8, in a way substantially independent of the depth considered, measured along Z, in each trench 8.

It is evident that it is possible to observe a different growth rate on the different crystal planes exposed by the dry etch of the trenches, as indicated previously. This fact, however, does not affect significantly formation of the layer of epitaxial silicon in the trenches 8. Moreover, since the exposed crystal planes are the same for all the trenches 8 of the wafer 1, the epitaxial growth is uniform and repeatable for all the trenches 8 considered.

Control of doping of the layer of epitaxial silicon being grown takes place by introducing, in the growth chamber itself, a flow of diborane. Said flow can be kept constant in time by virtue of the fact that, according to one aspect of the present disclosure, the flows of DCS and HCl are kept constant during the entire process of partial filling of the trenches 8.

However, both the amount of diborane and a possible variation of the flow of diborane are chosen on the basis of the specific requirements of the electronic device that is being manufactured, for example for guaranteeing a charge balance necessary for the structure of the electronic device that will be produced.

The ranges of values of the parameters for the step of FIG. 4 (formation of the layer of epitaxial silicon in the trenches 8 and simultaneous formation of a cavity 10) are:

pressure in the range from 30 to 80 Torr, preferably from 40 to 70 Torr, even more preferably from 50 to 60 Torr, for example approximately 55 Torr;

temperature in the range from 900° C. to 1100° C., in particular from 1000° C. to 1050° C., preferably from 1010° C. to 1020° C., for example approximately 1015° C.;

flow of the carrier $H_2$ in the range from 15 to 50 standard liters per minute (l/m), preferably from 30 to 40 l/m, for example 35 l/m;

flow of dichlorosilane (DCS) in the range from 100 sccm (i.e., approximately $1.6 \cdot 10^{-6}$ m$^3$/s) to 250 sccm (i.e., approximately $4.2 \cdot 10^{-6}$ m$^3$/s), in particular approximately 125 sccm (i.e., approximately $2 \cdot 10^{-6}$ m$^3$/s);

flow of hydrochloric acid (HCl) in the range from 400 sccm (i.e., approximately $6.7 \cdot 10$-6 m3/s) to 900 sccm (i.e., approximately $15 \cdot 10^{-6}$ m$^3$/s), preferably approximately 580 sccm (i.e., approximately $9.7 \cdot 10^{-6}$ m$^3$/s);

growth time comprised between 30 minutes and 1 hour.

The present applicant has found that, when the temperature is chosen in the interval 1000-1050° C. and the pressure in the interval 40-70 Torr, excellent results are obtained in terms of uniform covering of the side walls 8b of the trenches 8 and formation of a single cavity having controlled and repeatable shape and dimensions. The result is even better when the temperature is chosen in the interval 1010-1020° C. and the pressure in the interval 50-60 Torr. The values of flow of DCS and HCl are chosen in the ranges previously specified, and the best results have been obtained with a flow of DCS in the interval 100-200 sccm and a flow of HCl in the interval 500-600 sccm.

In addition, it is evident that the time of growth indicated previously is provided by way of example, and in particular is chosen on the basis of the depth of the trench 8.

For example, for trenches 8 with a depth of approximately 30 μm, using the aforementioned parameters, the time of growth is approximately 30 minutes. For trenches 8 with a depth of approximately 50 μm, using the aforementioned parameters, the time of growth is approximately 1 hour.

Moreover, what has been described herein may be applied to the growth of epitaxial silicon using silicon sources different from DCS, such as, for example, trichlorosilane, silicon tetrachloride, silane.

In addition, what has been described so far may be applied to the growth of other semiconductor materials different from silicon.

Moreover, according to the material grown, other etching gases may be used as an alternative to HCl.

Once again with reference to FIG. 4, the step of epitaxial growth leads to formation of filling regions 9 that extend on the bottom 8a of each trench 8 and on the internal wall 8b of each trench 8. Moreover, surface portions 9a of the filling regions 9 extend in the proximity of, and over, the surface 4, occluding the top part of each respective trench 8. Extending within each trench 8 is a respective void region or cavity 10, having, in cross-sectional view on the plane XZ, a main extension in the direction Z, separated from the wall 8b and from the bottom 8a of the respective trench 8 by the filling region 9.

Once again in cross-sectional view, each cavity 10 is delimited at the top and at the bottom by terminal portions 10a and 10b, extending at ends opposite to one another of the cavity 10, along one and the same axis A parallel to the direction Z.

Figure 5:
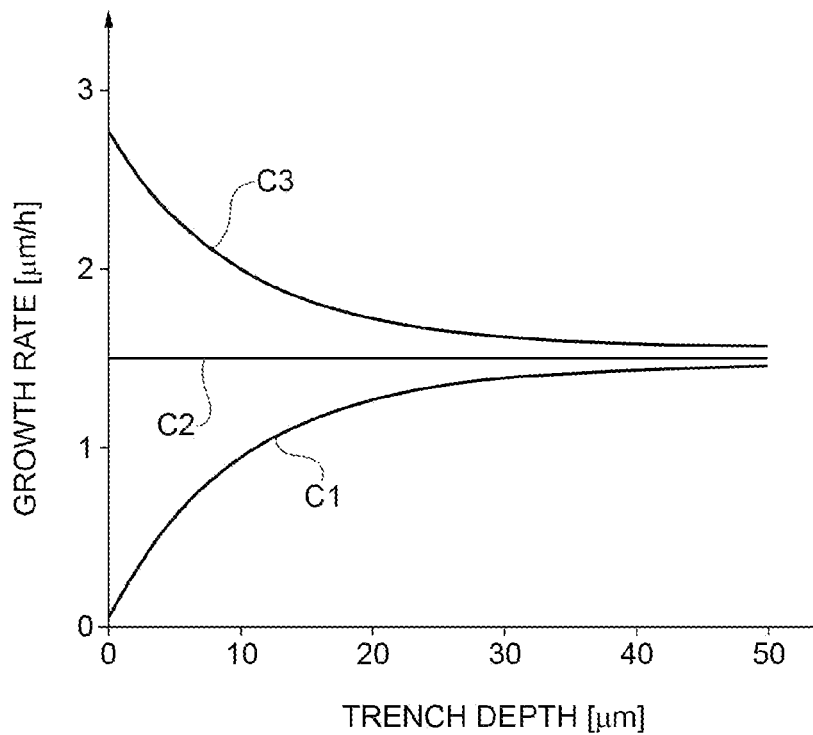
FIGS. 5 and 6 show, by means of graphs, the effect of variation of process parameters on the rate of growth of an epitaxial region illustrated in FIG. 4, according to the present disclosure.

FIG. 5 shows the profile of the rate of growth of the filling region 9 as a function of the depth (measured along Z starting from the surface 4) of the respective trench 8, for three values of the ratio $\Phi_{HCl}/\Phi_{DCS}$.

FIG. 5 illustrate a first curve C1, a second curve C2, and a third curve C3.

The second curve C2 identifies a ratio $R_2=(\Phi_{HCl}/\Phi_{DCS})=$ (506 sccm/110 sccm) of 4.6. The first curve C1 identifies a ratio $R_1=(\Phi_{HCl}/\Phi_{DCS})$ much greater than 4.6, whereas the third curve C3 identifies a ratio $R_3=(\Phi_{HCl}/\Phi_{DCS})$ much smaller than 4.6, so that $R_1>R_2>R_3$.

As may be noted from FIG. 5, in regions of the trench 8 close to the surface 4 (depth of the trench 8 close to zero) the rate of growth identified by the curve C1 is very low, this being a sign that the flow of HCl is such that a high percentage of the epitaxial layer being grown is removed. Consequently, the trench is not filled in a uniform way throughout its depth.

Instead, once again considering a depth of the trench 8 close to zero, the rate of growth identified by the curve C3 is very high, which is a sign that the flow of HCl has a low value and such as to not counter adequately formation of the epitaxial layer in the proximity of the surface 4. In this situation, the trench 8 tends to close very rapidly, with a high probability of the covering of the side wall 8b by the filling region 9 not being complete and uniform.

Instead, the rate of growth identified by the curve C2 shows a growth of the epitaxy that is substantially uniform irrespective of the depth considered for the trench 8. In this situation, the ratio $R_2$ between the flow of DCS and the flow of HCl is optimal, and the antagonistic effect between formation of the filling region 9 and etching thereof reaches an optimal equilibrium.

The present applicant has verified that the situation identified by the curve C2 can be obtained with values of the ratio $\Phi_{HCl}/\Phi D_{DCS}$ ranging from 3.5 to 5.5, preferably from 4 to 5, even more preferably from 4.2 to 4.8, for example approximately 4.6.

Figure 6:
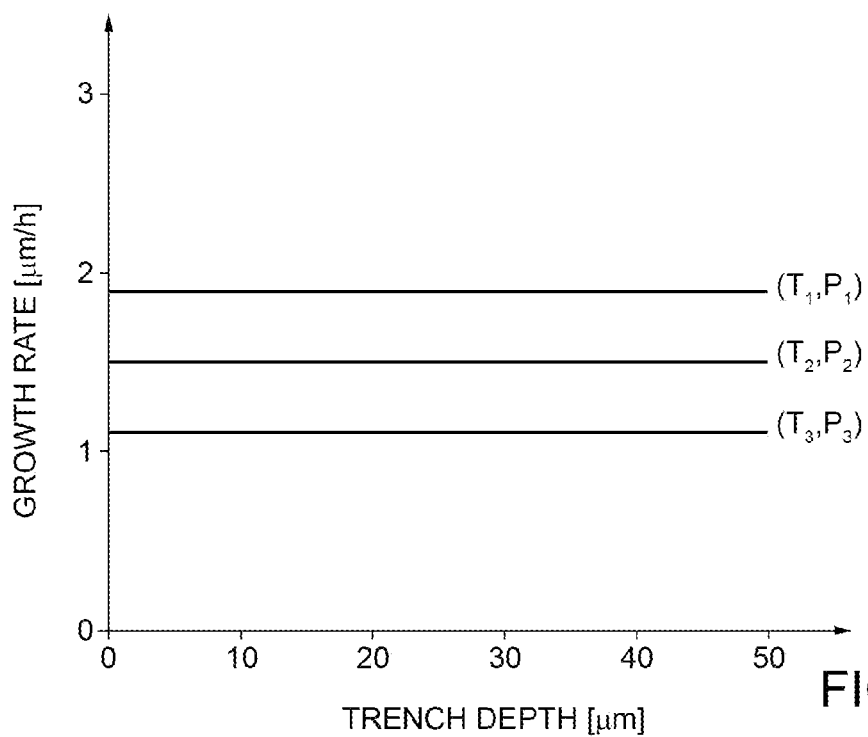

FIG. 6 shows the profile of the rate of growth of the filling region 9 as a function of the depth of the trench 8, for three different temperature values ($T_1$, $T_2$, $T_3$) and three different pressure values ($P_1$, $P_2$, $P_3$) of the chamber in which epitaxial growth of the filling region 9 takes place.

The first temperature-pressure pair ($T_1$, $P_1$) is chosen as (1050° C., 70 Torr), the second temperature-pressure pair ($T_2$, $P_2$) is chosen as (1025° C., 55 Torr), and the third temperature-pressure pair ($T_3$, $P_3$) is chosen as (1000° C., 40 Torr). As may be noted from FIG. 6, once a value of the ratio $\Phi_{HCl}/\Phi_{DCS}$ has been chosen that enables a substantially uniform epitaxial growth irrespective of the depth of the trench 8, as the value both of the pressure and of the temperature increases the rate of growth increases. The values of pressure and temperature are chosen, in particular, within the ranges indicated previously.

Figure 7:
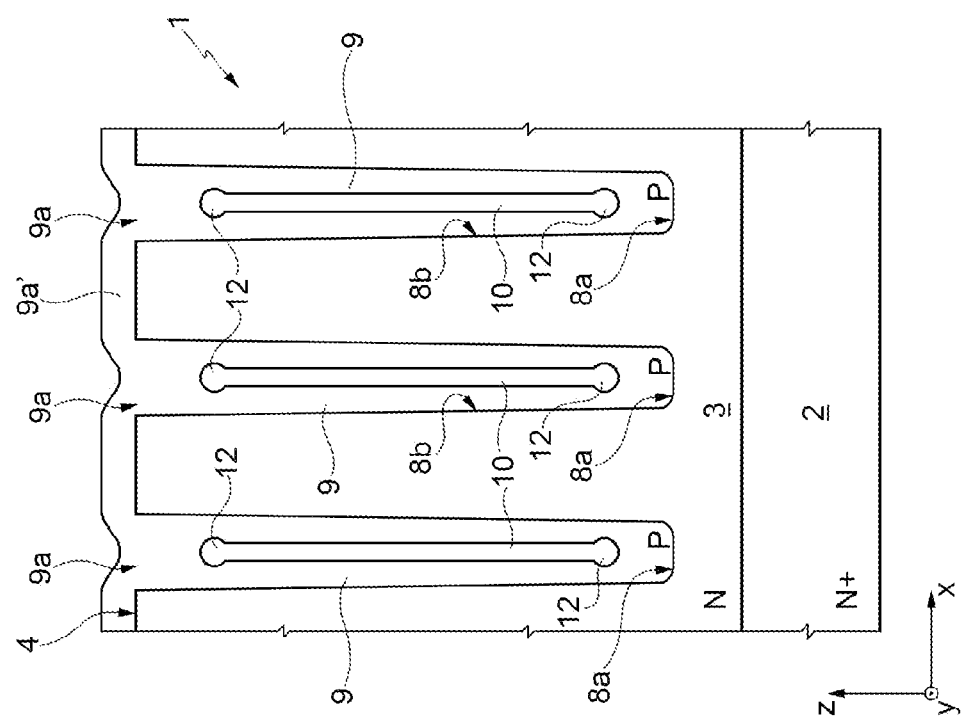

With reference to FIG. 7, a step of thermal treatment at high temperature of the wafer 1 is then carried out, in an environment saturated with an inert gas, in particular chosen from among hydrogen ($H_2$), helium (He), argon (Ar), nitrogen ($N_2$), preferably $H_2$ or $N_2$, in order to relieve stresses and lattice defectiveness within each partially filled trench 8.

The parameters of the thermal treatment of FIG. 7 are the following:
pressure: 40-760 Torr,
flow of gas ($H_2$, He, Ar, $N_2$): 10-100 l/m,
temperature: 1000-1200° C.,
treatment time: 10 min-120 min.

The aforementioned thermal process causes formation of two micro-void 12 in terminal portions 10a and 10b, opposite to one another in the direction Z, of each cavity 10. In the cross-sectional view of FIG. 7, these micro-voids 12 are represented with a substantially oval shape; however, they may assume non-perfectly oval shapes. It should be noted that formation of the micro-voids 12 occurs always at the terminal portions 10a and 10b of the cavities 10, and not in other portions of the filling regions 9. In this way, the cavity 10 and the micro-voids 12 concur in creating a single cavity (or macrocavity) inside each trench 8 completely surrounded by the filling region 9. Formation of the micro-voids 12 has been noted by the present applicant and is due to phenomena of surface mobility of the silicon atoms at the interface between the cavity 10 and the corresponding filling layer 9 that surrounds the cavity 10 during the step of thermal treatment, and to phases of settling of the crystal lattice of the filling region 9 that once again occur during the step of thermal treatment itself.

The process of epitaxial growth described with reference to FIG. 4 takes place also on the exposed surface 4, which, at the end of the process, has a characteristic horizontal layer (extending in the plane XY) of silicon of a P type with grooves localized at the openings of the trenches 8, now partially filled and occluded. The layer (designated by 9a') of P epitaxial silicon that extends over the surface 4 is present also at the periphery of the device (not shown) where trenches (or columns) 8 are not present. In this case, the layer of epitaxial silicon 9a' can advantageously be used as ring layer of the edge structure of the device that is to be produced.

Figure 8:
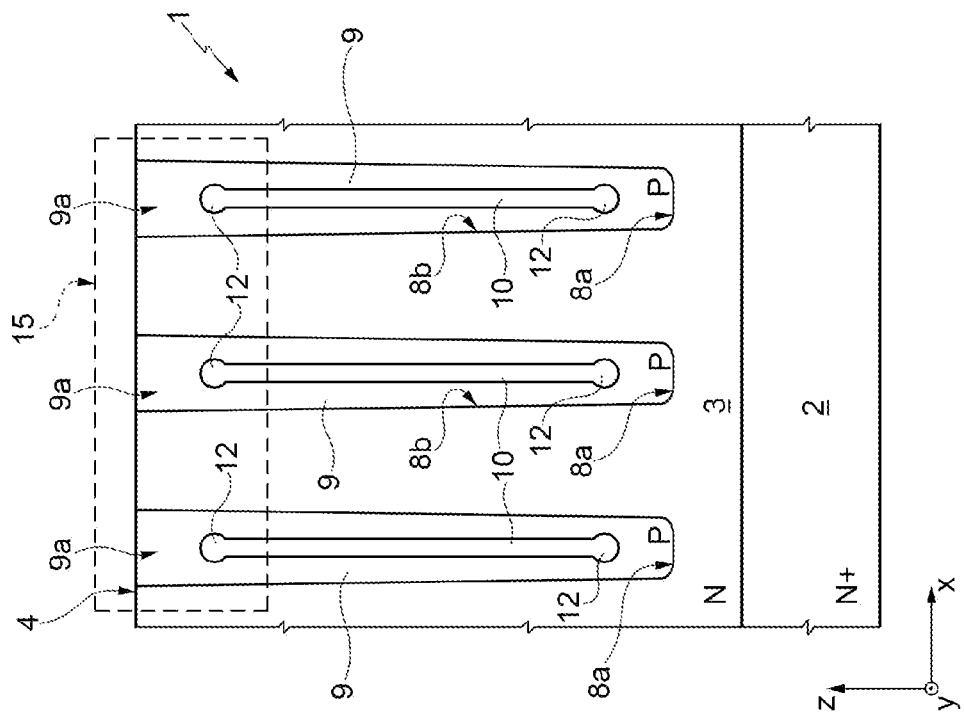
FIGS. 7-8 show further steps of processing of the semiconductor wafer of FIGS. 1-4, according to the present disclosure.

Alternatively, in the case where a planar surface is required, the structure of FIG. 7 is subjected to a step of planarization, for example via CMP (chemical mechanical polishing), so as to expose the surface 4 of the wafer, as illustrated in FIG. 8.

It is then possible to proceed with steps, in themselves known, of manufacture of an electronic device that includes the column structure, or partially filled trenches, just described. These further steps do not in themselves form the subject of the present disclosure. In what follows, however, certain examples of production of power devices based upon the charge-balance trench structure obtained according to what has been described previously will be described with reference to FIGS. 1-8, i.e., after planarization of the wafer 1.

In particular, the depth of the trenches 8, given the same thickness of the epitaxial layer 3, determines the voltage class of the final device: for example, trenches 8 (and hence filling regions 9) having a depth of 5 µm enable devices to be obtained that are able to withstand voltages of up to 100 V, whereas trenches 8 having a depth of 30 µm enable devices to be obtained that are able to withstand voltages of up to 600 V. In general, the solutions described herein make it possible to obtain devices with breakdown voltages comprised between 50 and 2000 V.

FIGS. 9-13 represent only a surface portion of the wafer 1, containing by way of example two strips, highlighted in FIG. 8 with a dashed rectangle 15.

Initially, in a way not shown, an edge region of the device is provided along the perimeter of the device, in a way in itself known.

Figure 9:
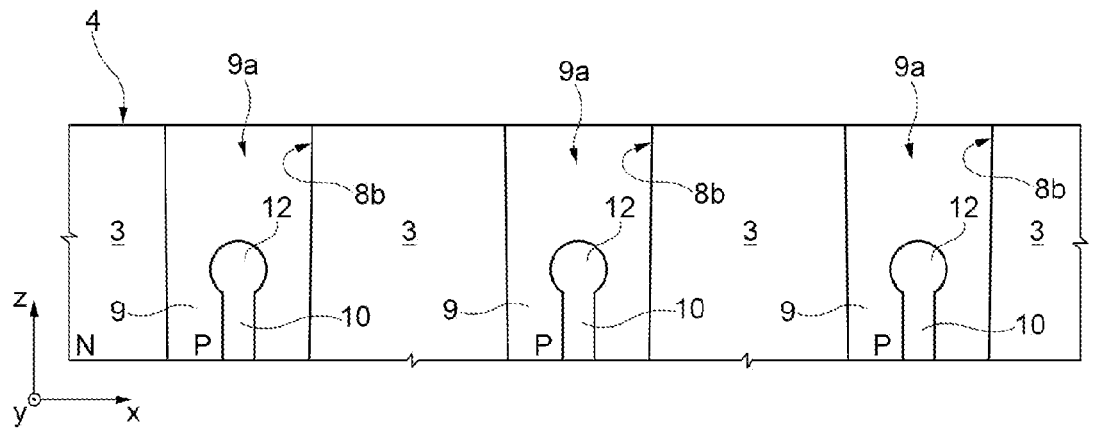
FIGS. 9-13 show, by means of an enlarged detail of the semiconductor wafer of FIG. 8, steps of completion of processing of the semiconductor wafer to obtain a semiconductor power device, according to a further aspect of the present disclosure.
Figure 10:
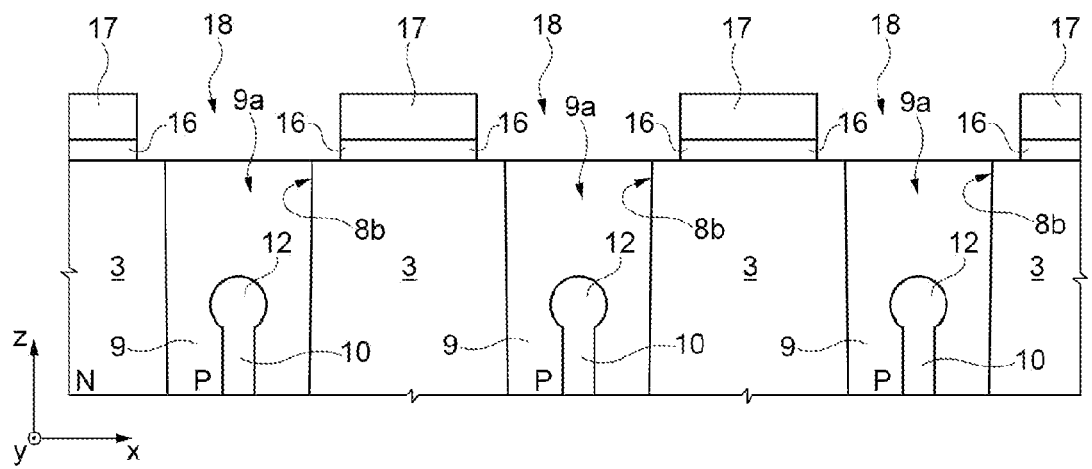

Then, in the active area, an oxide layer 16 (gate oxide) is first thermally grown, having a thickness, for example, of between 20 nm and 150 nm, and a polysilicon layer 17 is then deposited having a thickness, for example, of between 200 and 700 nm. The polysilicon layer 17 and oxide layer 16 are etched using a resist mask, for example aligned by means of appropriate zero-layer technique, so as to form openings 18 overlying the filling regions 9, also called columns 9 (FIGS. 9 and 10). Alternatively, the oxide layer may even not be etched, and the subsequent implants are carried out through said oxide layer.

Figure 11:
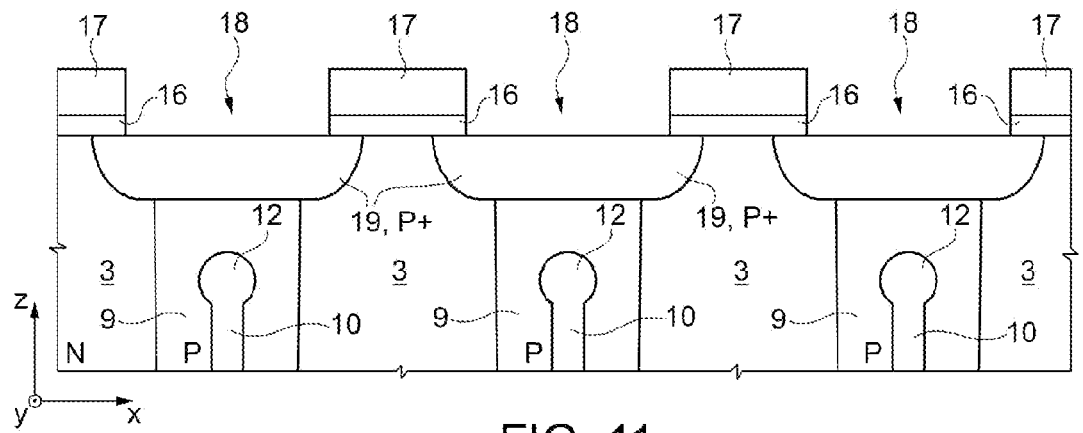

Using the openings 18 a "body" implant is carried out; in particular, boron is implanted with an implantation dose of between 1·e13 and 1·e14 atoms/cm$^2$ and energy comprised between 80 and 200 keV. After execution of a thermal diffusion process, the structure of FIG. 11 is obtained, where the body regions of a P+ type are designated by the reference number 19.

Figure 12:
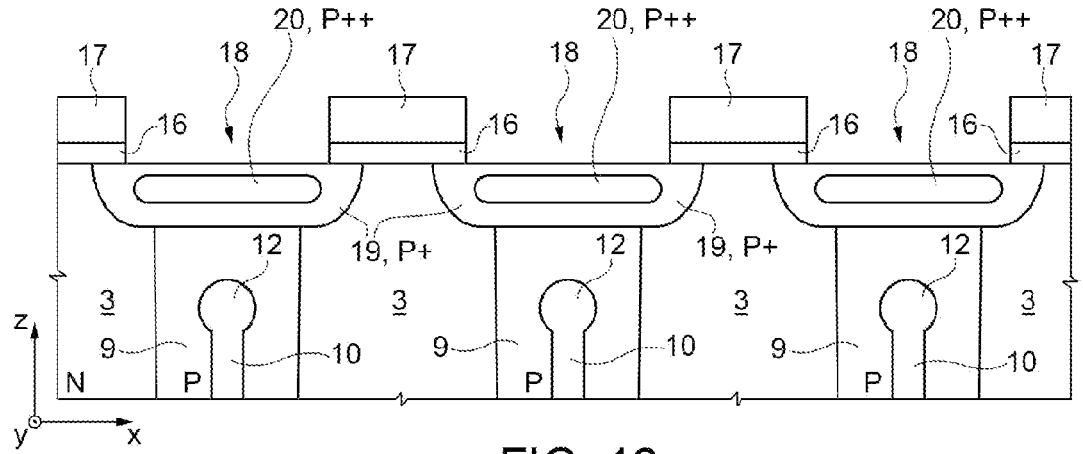
Figure 13:
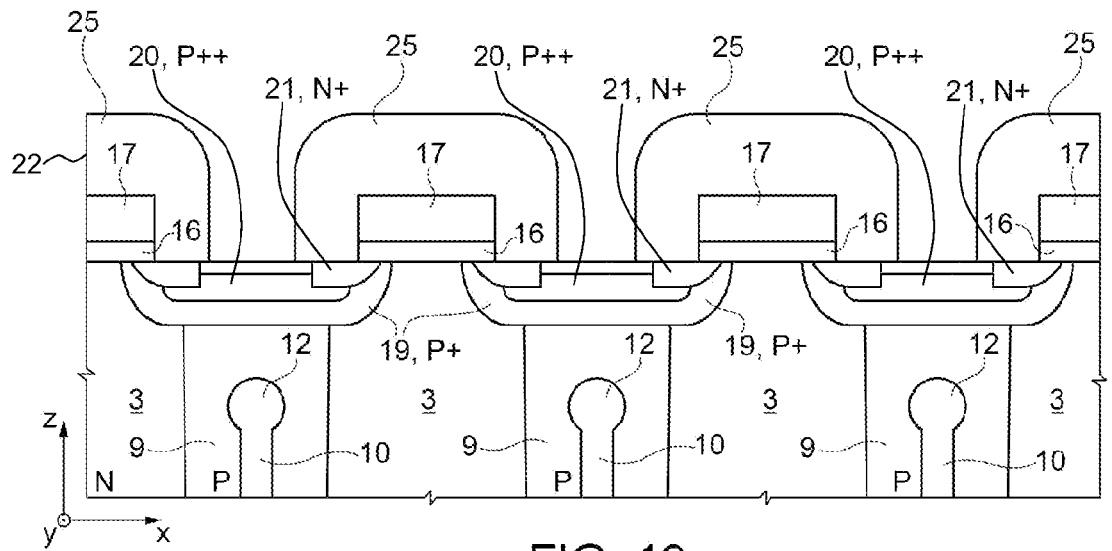

Then (FIG. 12), by means of a mask (not shown), a deep body implant is carried out; in particular, boron is implanted with an implantation dose comprised between 5·e14 and 5·e15 atoms/cm$^2$ and energy comprised between 80 and 300 keV. After execution of a thermal activation process, the structure of FIG. 12 is obtained, where the deep body regions of a P++ type are designated by the reference number 20.

Next (FIG. 13), via a mask (not shown), a source implant is carried out. In particular, phosphorus or arsenic are implanted with an implantation dose comprised between 5·e14 and 5·e15 atoms/cm$^2$ and energy comprised between 60 and 200 keV so as to form source regions 21 within the body regions 19. An intermediate dielectric layer 22 is then deposited with a thickness of between 500 nm and 1 µm, and a thermal activation process is carried out. Then the contacts are opened to obtain the structure of FIG. 13. The process of etching of the intermediate dielectric layer 22 may be entirely dry or have a first part wet and a second part dry and forms an insulated gate region 25.

Next, by means of a sputtering process, metallization of the front of the wafer 1 is carried out. A metal layer 26 is thus obtained, the thickness of which depends upon the current-carrying capacity to be guaranteed for the device (FIG. 14, which shows the entire portion of the wafer 1, processed according to the steps of FIGS. 9-13).

The process proceeds with final known steps, including etching of the metal layer 26, deposition of a passivation layer, and a subsequent step of masking and etching of the passivation layer.

Finally, there follows the process of finishing of the back side of the wafer 1.

Figure 14:
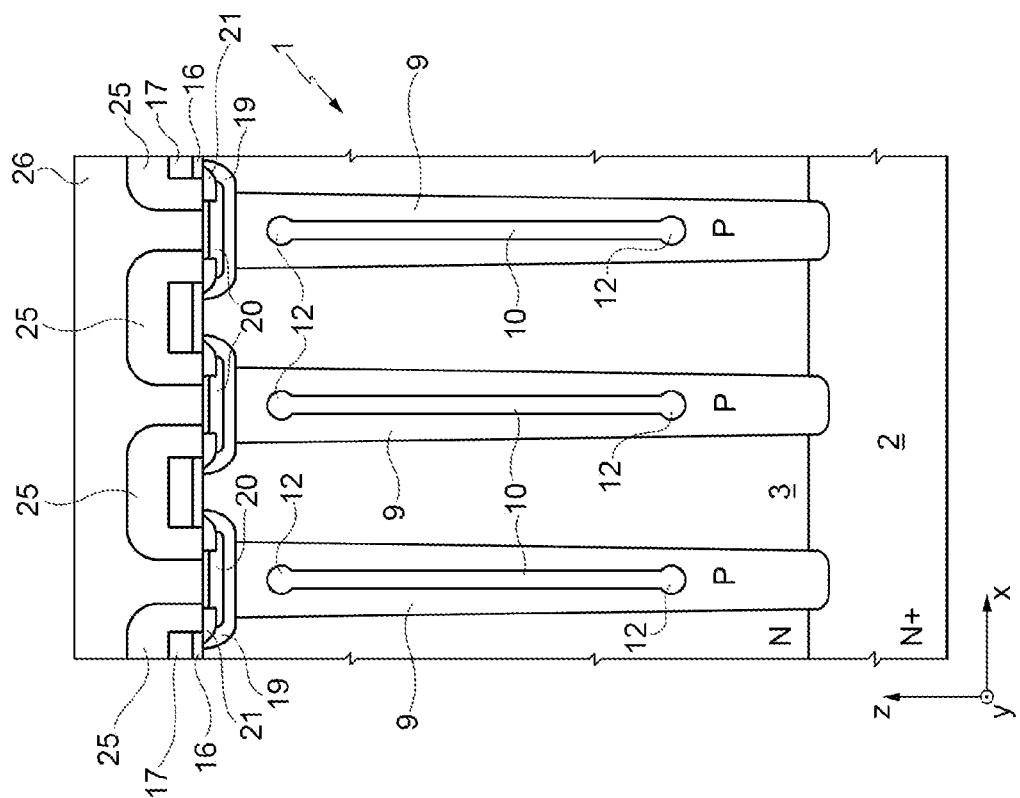
FIGS. 14-17 show respective semiconductor power devices processed according to the method of FIGS. 1-8.
Figure 15:
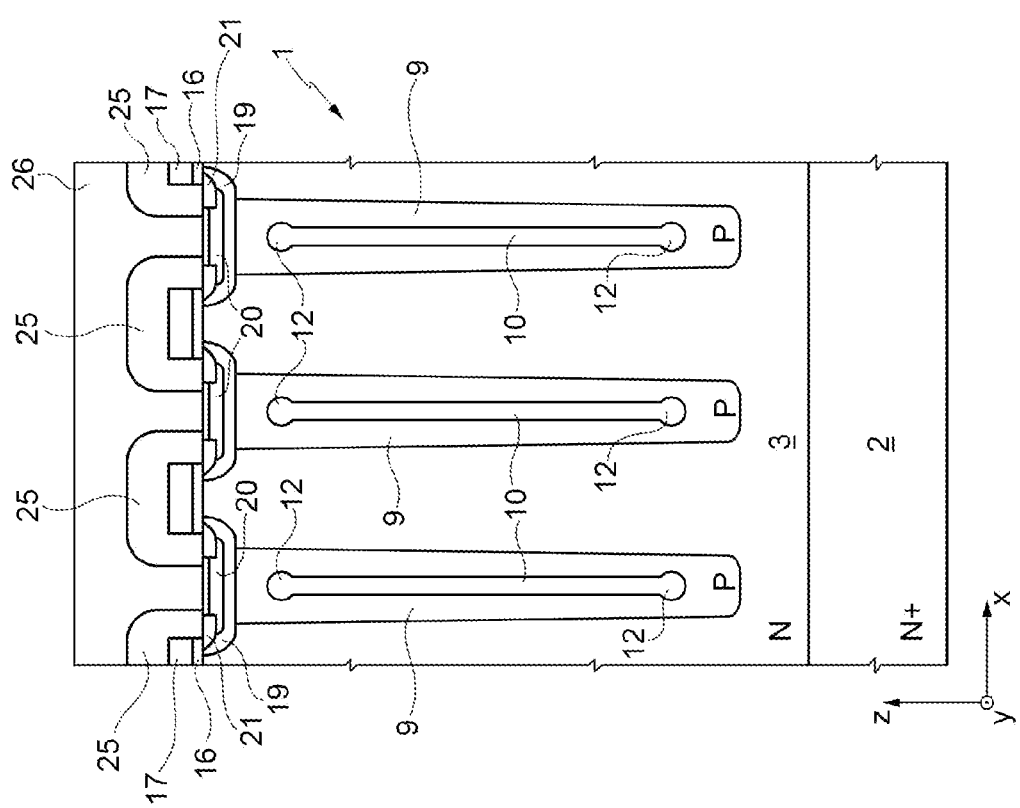

FIG. 15 shows a variant of the structure of FIG. 14, where the columns 9 extend throughout the thickness of the epitaxial layer 3 and terminate at the bottom inside the substrate 2.

Figure 16:
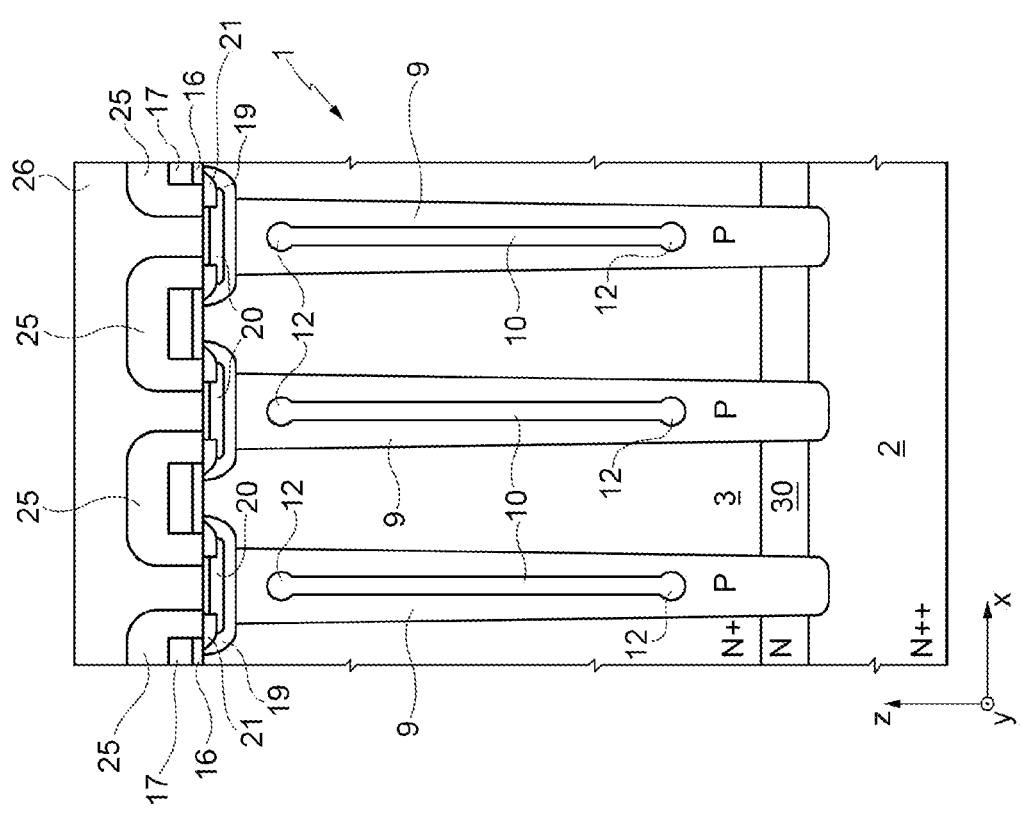

FIG. 16 shows a further variant of the structure of FIG. 14, where a buffer layer 30 of an N type and having a resistivity comprised between 100 mΩ·cm and 5 Ω·cm extends between the substrate 2 and the epitaxial layer 3. In this case, the columns 9 terminate within the buffer layer 30.

The electronic devices of FIGS. 14-16 are of a planar type; however, it is evident that the manufacturing method according to the present disclosure applies in a similar way to electronic devices of the trench-gate type.

Figure 17:
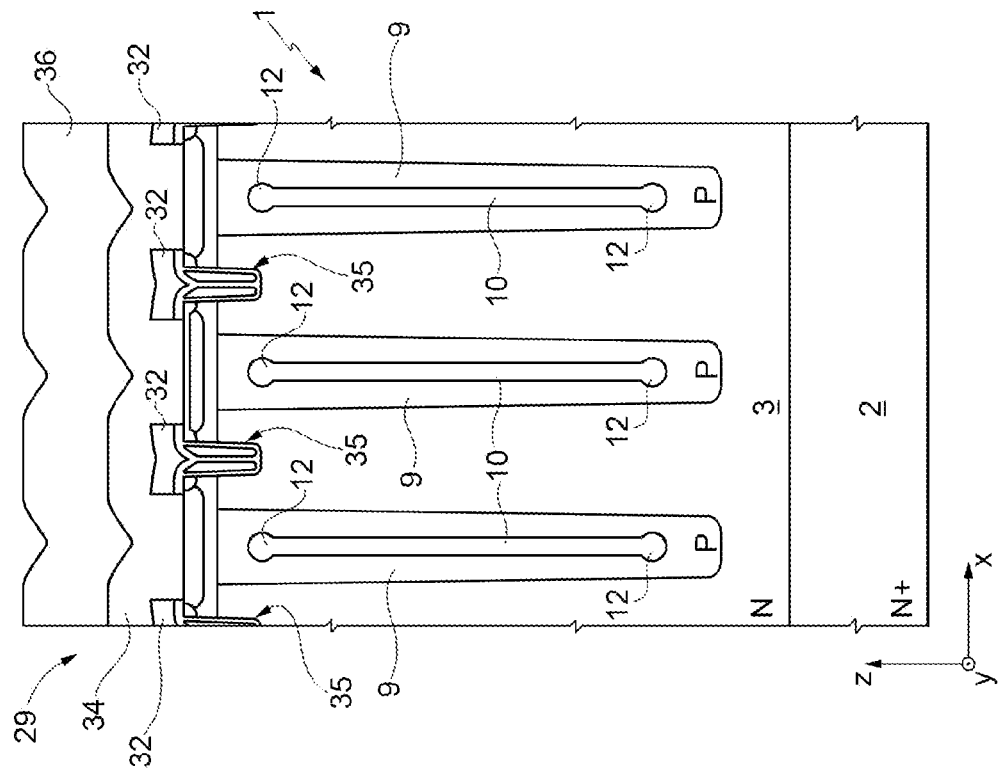

FIG. 17 shows, by way of example, a trench-gate device 29 provided with a plurality of trenches 8 that extend between adjacent gate regions 35, where each trench 8 is provided with a respective filling region 9 obtained according to the method of the present disclosure and has a respective internal cavity 10 and micro-voids 12 forming a single void region completely surrounded by the respective filling region 9. The trench-gate device 29 moreover has, in a way in itself known, not forming the subject of the present disclosure and hence not described in detail herein, gate-biasing regions 32, gate-insulation regions 34, and a top metallization 36.

The advantages of the disclosure emerge in an evident way from the foregoing description.

The method described according to the present disclosure enables deep doped trenches to be obtained in electronic power devices in a fast way (in a single manufacturing step and using a single equipment) and in an inexpensive way. Moreover any problems of stress induced by fillings of the trenches with dielectric are prevented, and there is avoided the need to resort to ion implantation in order to carry out doping, with two very narrow opposite angles with respect to the vertical, of the internal wall of the trenches in order to form the superjunction.

In addition, according to the present disclosure, the process of filling and doping of the trenches is highly repeatable in so far as any problems linked to random formation of a plurality of micro-voids inside the trenches are prevented.

Furthermore, the method described presents a particular simplicity of production as compared to the processes that require a plurality of steps of epitaxial growth, and hence enables a reduction of the cycle time. This causes the costs for production of the devices to be considerably lower than the ones that can be obtained with the known processes.

As compared to the processes that require a plurality of steps of epitaxial growth, the method described moreover enables an epitaxial layer of better quality to be obtained, with reduced defectiveness.

With the method described, it is possible to provide devices of different voltage classes (from medium voltages, 50-100 V, up to 1000-2000 V) by varying only the depth of the trenches, and hence with substantially the same costs.

Moreover, it enables improvements of the performance to be achieved in so far as it is possible to increase the density of the strips (further reducing the resistivity of the epitaxy) by appropriately varying the process of epitaxial filling.

Finally, it is clear that modifications and variations may be made to what has been described and illustrated herein, without thereby departing from the sphere of protection of the present disclosure.

For example, even though the method described refers to a wafer of an N type provided with columns of a P type, it is possible to obtain dual structures, where a wafer of a P type houses columns of an N type. In this case, the step of epitaxial growth to form the filling regions 9 of the trenches 8 includes introducing into the growth chamber dopant agents of an N type.

The method according to the present disclosure may be applied to the production of generic power devices (such as, for example, diodes, MOSFETs, IGBTs, bipolar transistors, etc.) with breakdown voltages ranging approximately between 50 V and 2000 V.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing a semiconductor power device, the manufacturing including:
      forming a trench in a semiconductor body, the body having a first type of conductivity; and
      forming a first column having a height by partially filling said trench with a semiconductor material via epitaxial growth, the first column having a second type of conductivity, the forming of the first column including:
         forming an internal cavity extending along the height, the internal cavity having a central portion, a first end, and a second end, the first end being separated from the second end by the central portion, both the first and second ends being wider than the central portion.

2. The method according to claim 1 wherein said epitaxial growth includes simultaneously supplying a gas containing dopant ions of said second type of conductivity, a halogenide gas, and a gas containing atoms of said semiconductor material.

3. The method according to claim 2 wherein a ratio between an amount of said halogenide gas and an amount of said gas containing atoms of said semiconductor material has a value from 3.5 to 5.5.

4. The method according to claim 2 wherein said gas containing atoms of said semiconductor material is dichlorosilane and said halogenide gas is hydrochloric acid.

5. The method according to claim 4 wherein the dichlorosilane and the hydrochloric acid are supplied according to respective constant flows, the flow of dichlorosilane being comprised between about 100 sccm and about 250 sccm and the flow of hydrochloric acid being comprised between about 400 sccm and about 900 sccm.

6. The method according to claim 2 wherein said simultaneously supplying the gas containing atoms of said semiconductor material and the halogenide gas are carried out in the presence of a carrier gas.

7. The method according to claim 2 wherein said supplying a gas containing dopant ions comprises supplying diborane.

8. The method according to claim 1, further comprising, after said epitaxial growth, carrying out a first thermal treatment of said semiconductor body at a temperature comprised between 1000° C. and 1200° C., in an environment saturated with an inert gas.

9. The method according to claim 1 wherein said forming a trench comprises covering said semiconductor body with a mask and etching selective regions of said semiconductor body not protected by said mask, said filling said trench being carried out in the absence of said hard mask.

10. The method according to claim 1 wherein said semiconductor body has a surface, said forming a trench including forming the trench starting from said surface, said epitaxial growth being followed by a chemical-mechanical polishing of surface portions of said semiconductor material extending over said surface.

11. The method according to claim 1, comprising, after said forming a trench and prior to said epitaxial growth, carrying out a washing operation and a second thermal treatment.

12. The method according to claim 1, further comprising the steps of:
   forming at least one second column similar to said first column and set at a distance from said first column;
   forming insulated gate regions on said semiconductor body, between the first and second columns;
   implanting body regions of said second type of conductivity in said body of semiconductor material, said body regions being aligned with, and having a doping level higher than, said first and second columns;
   forming source regions of said first type of conductivity within said body regions; and
   forming metal contact regions in electrical contact with said body regions and said source regions.

13. A semiconductor power device, comprising:
   a semiconductor body having a first type of conductivity, the body having a surface extending in a horizontal plane;
   a trench in said semiconductor body, the trench having sidewalls and a bottom; and
   a first column, including a region of semiconductor material extending along the sidewalls and the bottom of said trench, said region of semiconductor material housing dopant ions of a second type of conductivity, said first column encloses a single cavity completely surrounded by said region of semiconductor material and having, in lateral cross-sectional view, a main extension substantially aligned with a vertical direction orthogonal to said horizontal plane, the cavity having a first end and a second end that are wider than the main extension.

14. The device according to claim 13 wherein the first end and the second end have a bulbous shape and the main extension has an elongated rectangular shape.

15. The device according to claim 13 wherein the main extension is a main void region and the first end and the second end are secondary void regions extending at opposite ends of the main void region, in said vertical direction, of the main void region, the secondary void regions being in fluidic connection with the main void region.

16. The device according to claim 13 wherein said first column has a width comprised between 0.8 and 3.5 µm, and a depth comprised between 20 and 60 µm.

17. The device according to claim 13, further comprising:
   at least one second column, similar to said first column, and set at a distance from said first column;
   insulated gate regions extending over said semiconductor body, between said first and second columns;
   body regions of said second type of conductivity extending in said semiconductor body, said body regions being aligned with and having a doping level higher than said columns;
   source regions of said first type of conductivity extending within said body regions; and
   metal contact regions extending over said semiconductor body and said insulated gate regions and in electrical contact with said body regions and said source regions.

18. The device according to claim 13, comprising a plurality of second columns similar to said first column, wherein the distance between two adjacent columns in a direction parallel to the horizontal plane is comprised between 2 and 10 µm.

19. A device, comprising:
   a substrate;
   a first doped layer on the substrate, the first doped layer having a first conductivity type;
   a first trench in the first doped layer;
   a second doped layer in the first trench, the second doped layer having a second conductivity type; and
   an elongated opening in the second layer, in the trench, the elongated opening having a first end having a first width, a second end having a second width, and a main extension having a third width, the first width and the second width each being larger than the first width.

20. The device of claim 19 wherein the first trench has a first dimension from a top of the trench to a bottom of the trench, the first end of the elongated opening being spaced from the bottom of the trench by a second dimension and the second end of the elongated opening being spaced from the top by a third dimension, the second dimension being smaller than the third dimension.

21. The device of claim 19 wherein a bottom of the trench extends into the substrate.

* * * * *